US012336440B2

(12) United States Patent
Gouraud et al.

(10) Patent No.: US 12,336,440 B2
(45) Date of Patent: Jun. 17, 2025

(54) PHASE CHANGE MEMORY

(71) Applicant: STMicroelectronics (Crolles 2) SAS, Crolles (FR)

(72) Inventors: Pascal Gouraud, St Martin (FR); Laurent Favennec, Villard Bonnot (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 364 days.

(21) Appl. No.: 17/751,190

(22) Filed: May 23, 2022

(65) Prior Publication Data

US 2022/0384721 A1    Dec. 1, 2022

(30) Foreign Application Priority Data

May 28, 2021  (FR) ...................................... 2105618

(51) Int. Cl.
*G11C 13/00*  (2006.01)
*H10B 63/00*  (2023.01)
*H10N 70/00*  (2023.01)
*H10N 70/20*  (2023.01)

(52) U.S. Cl.
CPC ....... *H10N 70/231* (2023.02); *G11C 13/0004* (2013.01); *H10B 63/80* (2023.02); *H10N 70/021* (2023.02); *H10N 70/063* (2023.02); *H10N 70/882* (2023.02); *H10N 70/8833* (2023.02)

(58) Field of Classification Search
CPC .......................... G11C 13/0004; G11C 13/00
See application file for complete search history.

(56) References Cited

U.S. PATENT DOCUMENTS

| | | | |
|---|---|---|---|
| 2009/0101883 A1 | 4/2009 | Lai et al. | |
| 2017/0263862 A1* | 9/2017 | Bernhardt | ............ H10N 70/826 |
| 2018/0358547 A1 | 12/2018 | Yang et al. | |
| 2019/0131348 A1 | 5/2019 | Ko | |
| 2020/0044148 A1 | 2/2020 | Trinh et al. | |
| 2020/0098989 A1 | 3/2020 | Canvel et al. | |
| 2022/0293854 A1* | 9/2022 | Tseng | ................... H10N 70/021 |

OTHER PUBLICATIONS

INPI Search Report and Written Opinion for priority application, FR 2105618, report dated Feb. 11, 2022, 8 pgs.

* cited by examiner

*Primary Examiner* — Alfredo Bermudez Lozada
(74) *Attorney, Agent, or Firm* — Crowe & Dunlevy LLC

(57) ABSTRACT

A memory cell is manufactured by: (a) forming a stack comprising a first layer made of a phase change material and a second layer made of a conductive material; (b) forming a mask on the stack covering only the memory cell location; and (c) etching portions of the stack not covered by the first mask. The formation of the mask covering only the memory cell location comprises defining a first mask extending in a row direction for each row of memory cell locations and then patterning the first mask in a column direction for each column of memory cell locations.

44 Claims, 3 Drawing Sheets

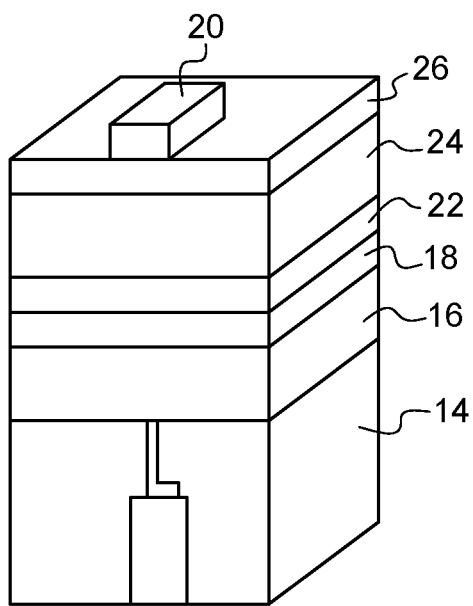
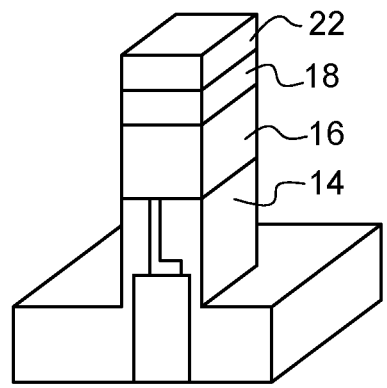
Fig. 5          Fig. 6
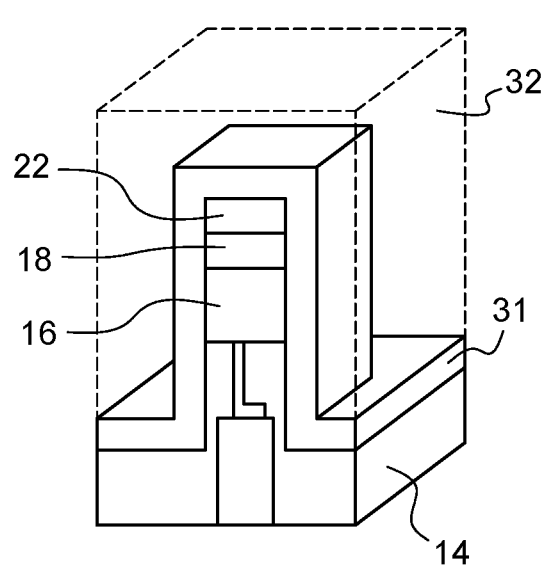
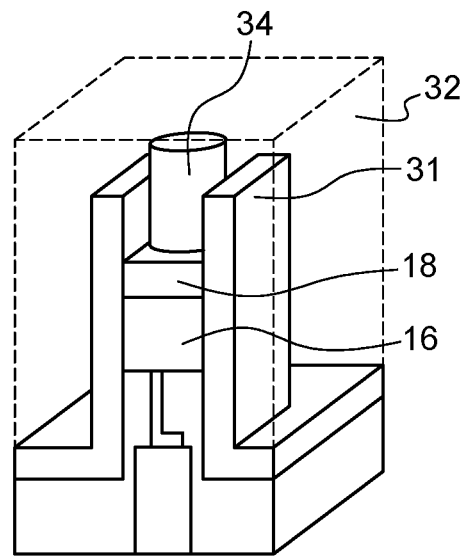
Fig. 7          Fig. 8

PHASE CHANGE MEMORY

PRIORITY CLAIM

This application claims the priority benefit of French Application for Patent No. 2105618, filed on May 28, 2021, the content of which is hereby incorporated by reference in its entirety to the maximum extent allowable by law.

TECHNICAL FIELD

The present disclosure relates to electronic devices generally and, more particularly, to phase change memories and their manufacturing method.

BACKGROUND

Phase change materials are materials that can switch between a crystalline and an amorphous phase under the effect of heat. Since the electrical resistance of an amorphous material is significantly higher than the electrical resistance of a crystalline material, this phenomenon can be useful in defining two memory states, such as 0 and 1, differentiated by the resistance measured through the phase change material.

The memory cells are preferably arranged within a memory as an array comprising lines, related to word lines, and columns for example, related to bit lines, for example.

SUMMARY

One embodiment provides a method for manufacturing a memory cell comprising: a) forming a stack comprising a first layer of a phase change material and a second layer of conductive material; b) forming a first mask on the stack covering only the memory cell location; and c) etching portions of the stack not covered by the first mask.

According to one embodiment, step a) comprises forming at least a third layer of electrically insulating material between the second layer and the first mask.

According to one embodiment, step c) does not etching the first layer and another layer of another material at the same time.

According to one embodiment, the method comprises forming a resistive element in contact with the first layer.

According to one embodiment, step b) comprises: depositing a fourth layer of a material of the first mask on the stack; forming a second mask extending in a first direction and covering the memory cell location; etching portions of the fourth layer not covered by the second mask; forming a third mask extending in a second direction and covering the memory cell location; and etching portions of the fourth layer not covered by the third mask.

According to one embodiment, the etching method used for etching the fourth layer etches the material of the fourth layer at least twenty times faster than the material of the layer located below the fourth layer.

According to one embodiment, the first mask is made of titanium nitride.

According to one embodiment, the first layer is made of a germanium, antimony and tellurium alloy.

According to one embodiment, the method comprises manufacturing an array of memory cells, each cell being manufactured by a method according to the method described above.

According to one embodiment, a first mask is formed over the location of each memory cell, and wherein step c) is performed simultaneously for all cells.

According to one embodiment, each first mask is common to a line of cells in the array, and wherein each second mask is common to a column of cells in the array.

According to one embodiment, the method comprises depositing at least one electrically insulating layer on the cells of the array.

According to one embodiment, the method comprises depositing electrically conductive vias through the insulating layer so as to reach the second layer.

According to one embodiment, the method comprises forming a conductive band extending over the second layers of cells in a line or column of the array.

BRIEF DESCRIPTION OF THE DRAWINGS

The foregoing features and advantages, as well as others, will be described in detail in the following description of specific embodiments given by way of illustration and not limitation with reference to the accompanying drawings, in which:

FIGS. 1 through 8 illustrate steps, preferably successive steps, of one embodiment of a method for manufacturing a phase change memory;

DETAILED DESCRIPTION

Like features have been designated by like references in the various figures. In particular, the structural and/or functional features that are common among the various embodiments may have the same references and may dispose identical structural, dimensional and material properties.

For the sake of clarity, only the operations and elements that are useful for an understanding of the embodiments described herein have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

FIGS. 1 through 8 illustrate steps, preferably successive steps, of one embodiment of a method for manufacturing a phase change memory.

Figure 1:
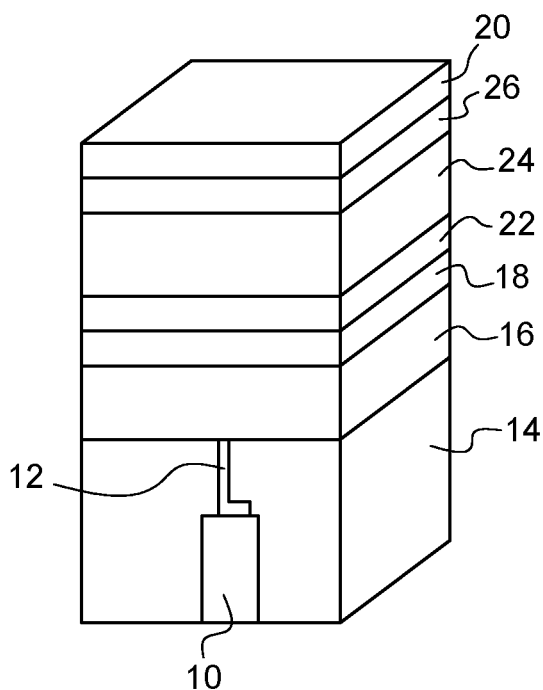

FIG. 1 illustrates one step of an embodiment of a method for manufacturing a phase change memory cell.

This manufacturing step comprises forming a conductive via 10. This step comprises manufacturing a resistive element 12, resting on the conductive via 10. The resistive element 12 is preferably L-shaped, with a horizontal portion resting on the via 10 and a vertical portion extending substantially perpendicular to the horizontal portion. The via 10 and the resistive element 12 are surrounded by an electrically insulating layer 14. An upper surface of the vertical portion of the resistive element 12 is flush with an upper surface of the layer 14. The layer 14 comprises a stack of a plurality of electrically insulating layers, for example, of different electrically insulating materials for example.

The layer 14 and the upper surface of the vertical portion of the resistive element are covered by a stack of layers comprising: a layer 16 made of a phase change material; a layer 18 made of a conductive material; and a hard mask 20.

The layer 16 is a planar layer covering the upper surface of the vertical portion of the resistive element 12 and preferably completely covers the layer 14. The layer 16 is thus in contact with the layer 14. The layer 16 is preferably made of a germanium-antimony-tellurium (GST) alloy. The layer 18 is titanium nitride, for example.

The mask 20 is a layer, preferably extending across all the layer 18. The mask 20 is made of a metal or metal alloy such as titanium nitride, for example.

The mask 20 and the layer 18 are separated by one or more layers in the stack, such as insulating layers, for example, forming an etching mask. In the example shown in FIG. 1, the mask 20 and the layer 18 are separated by: a layer 22 made of electrically insulating material, such as silicon nitride, for example; a layer 24 made of an electrically insulating material, such as amorphous carbon, for example; and a layer 26 made of an anti-reflective material for lithography, such as an electrically insulating material, for example, comprising silicon oxide.

Figure 2:
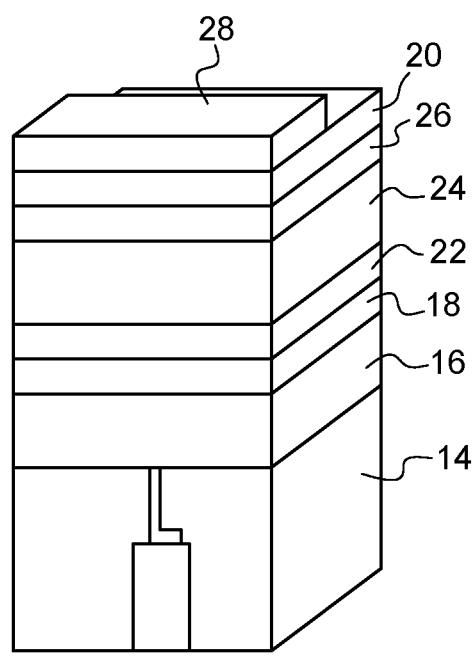

FIG. 2 illustrates another step in one embodiment of a method for manufacturing a phase change memory cell.

During this step, a band 28 is formed on the mask 20. The band 28 corresponds to a photolithography mask, for example.

The band 28 covers the memory cell location. The band 28 extends in a first direction in the direction of a line of the memory cell array, for example. For example, the band 28 covers the locations of multiple cells, such as all cells in the line (i.e., row) of the array. In a direction orthogonal to the line direction, corresponding to a column direction of the array, for example, the band 28 covers the location of only one memory cell.

Figure 3:
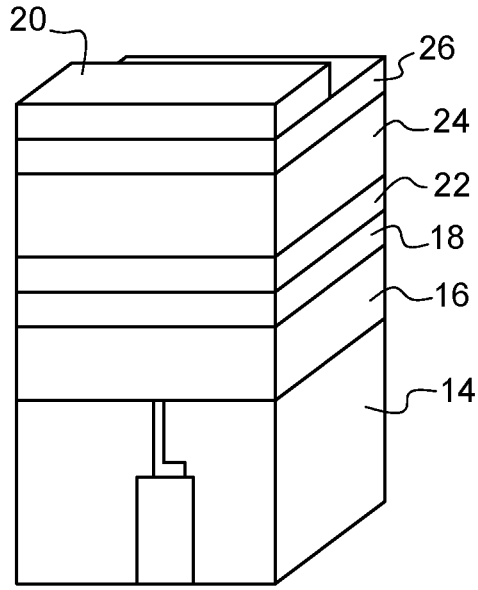

FIG. 3 illustrates another step in one embodiment of a method for manufacturing a phase change memory cell.

In this step, the portions of mask 20 not covered by the band 28 are etched. The etching is preferably a selective etching of the material of the mask 20 in relation to the layer material beneath the mask 20, such as the material of layer 26. Preferably, the etching method etches the layer material 20 at least 20 times faster than the material of layer 26. Preferably, only the mask 20 is etched during this step. Preferably, the layers 18, 22, 24 and 26 are not etched during this step. The layer 16 is not etched during this step.

The band 28 is then removed.

Figure 4:
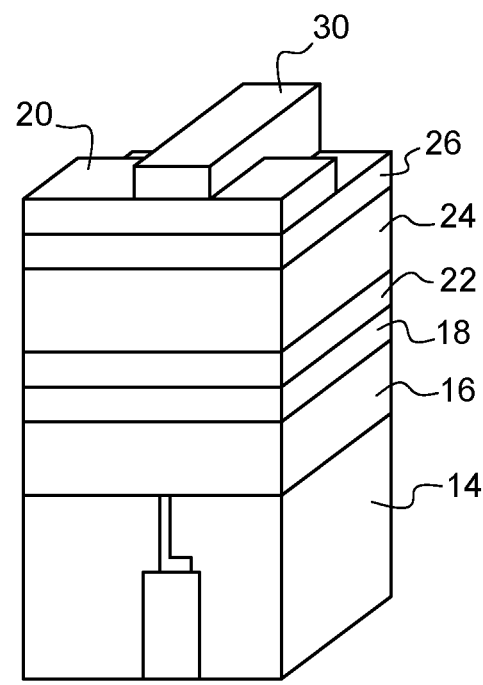

FIG. 4 illustrates another step in one embodiment of a method for manufacturing a phase change memory cell.

In this step, a band 30 is formed on the mask 20. The band 30 corresponds to a photolithography mask, for example.

The band 30 covers the location of the memory cell. The band 30 extends in a second direction, substantially orthogonal to the first direction, for example, such as in the direction of a column of the memory cell array. The band 30 overlaps the locations of several cells, for example, such as all the cells in the column of the array. In a direction orthogonal to the column direction, corresponding to the direction of a line (row) of the array, for example, the band 30 covers the location of only one memory cell.

The band 30 covers the mask portion 20 located at the memory cell location. Preferably, the band 30 covers only the mask portion 20 located at the memory cell location. For example, the band 30 covers a portion of the layer 26.

FIG. 5 illustrates another step in one embodiment of a method for manufacturing a phase change memory cell.

In this step, the portions of the mask 20 not covered by the band 30 are etched. The etching is preferably a selective etching of the material of the mask 20 in relation to the layer material beneath the mask 20, such as the material of the layer 26. Preferably, only the mask 20 is etched during this step. Preferably, the layers 18, 22, 24 and 26 are not etched during this step. The layer 16 is not etched during this step.

The band 30 is then removed.

The mask 20 obtained as a result of the step in FIG. 5 is preferably a rectangular parallelepiped.

The steps in FIGS. 2 through 5 make it possible to form the mask 20 covering the memory cell location. The mask 20 is thus facing the memory cell location, preferably only facing the memory cell location.

In a variant, the steps in FIGS. 2 through 5 may be replaced by forming a mask replacing the masks 28 and 30 and covering only the memory cell location and etching the mask layer 20. The formation of the mask 20 then comprises only a single etching of the mask layer 20.

FIG. 6 illustrates another step in one embodiment of a method for manufacturing a phase change memory cell.

This step comprises etching of the layers 26, 18, and 16 around the mask 20, as well as the layers separating the layer 18 and the mask 20, in this case the layers 22, 24, and 26. This step may also comprise the etching a portion of the layer 14 around the memory cell.

The layers of the stack, i.e., the layers 16, 18, 22, 24, and 26, are planar layers that extending in a planar fashion around the memory cell, for example, throughout the memory cell array location. In particular, the layer 16 of phase change material extends continuously between the individual memory cells of the array. Thus, during the stack etching step, i.e., the step in FIG. 6, the materials of the individual layers are not etched simultaneously. In particular, the material of the layer 16 is not etched at the same time as the material of the other layers in the stack.

At least some of the layers located above the layer 18 are also removed. In the example shown in FIG. 6, the layers 24, 26, and 20 are removed from the memory cell location.

Forming a memory cell could have chosen a method comprising: a first etching of the stack comprising the phase change material layer 16 so as to separate the array lines from each other; depositing one or more electrically insulating layers between the array lines, in particular; and a second etching of the stack comprising the phase change material layer 16 so as to separate the array columns from each other. The layer 16 would then be etched along with the electrically insulating material formed at the layer 16 between the lines. Simultaneous etching of the phase change material and another material, particularly an electrically insulating material, can alter the phase change material and decrease the efficiency of the memory cell.

FIG. 7 illustrates another step in one embodiment of a method for manufacturing a phase change memory.

This step comprises the compliant (i.e., conformal) deposit of a passivation layer 31. The layer 31 is made of an electrically insulating material, for example, such as silicon nitride. The passivation layer 31 covers the walls of layers 14, 16, 18, and 22 uncovered by the etching of the step in FIG. 6. The passivation layer 31 covers the upper surface of the memory cell, in this case the upper surface of the layer 22.

This step further comprises the formation of a layer 32 shown, in transparency, by dotted lines. The layer 32 is made of an electrically insulating material, such as silicon oxide.

Figure 9:
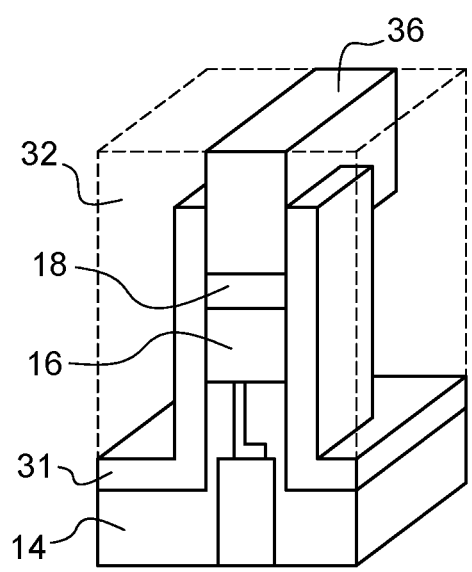
FIG. 9 illustrates an alternative step to the step of FIG. 8.
Figure 10:
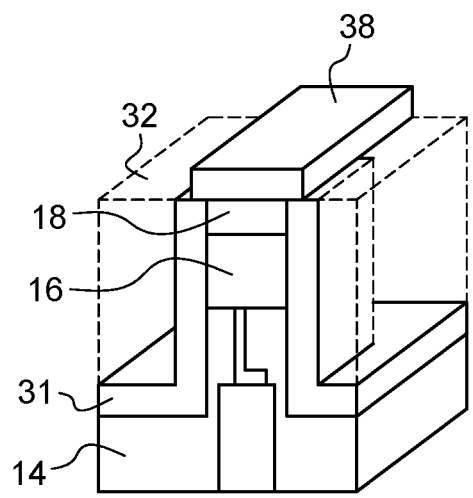
FIG. 10 illustrates an alternative step to the steps of FIGS. 8 and 9.

FIGS. 8 through 10 illustrate three distinct embodiments of a step for manufacturing an upper contact or electrode of the cell.

FIG. 8 illustrates another step in one embodiment of a method for manufacturing a phase change memory. Specifically, FIG. 8 shows the formation of a conductive via 34. This step is preferably performed after the step in FIG. 7.

This step comprises forming a cavity extending from the upper surface of the layer 32 to the layer 18 and filling this cavity with a conductive material, such as a metal. The cavity is etched through the layer 32, the passivation layer 31, and the layer 22, so as to reach the conductive layer 18. The vias 34 of cells in the same line or column of the cell array are connected by a conductive band, not shown, for example, resting on the upper surface of layer 32, for example.

FIG. 9 illustrates an alternative step to the FIG. 8 step. In other words, this step is performed following the FIG. 7 step, instead of the FIG. 8 step. Specifically, FIG. 9 shows the formation of a conductive band 36 connecting the cells in the same line or column.

During this step, a cavity is etched into layer 32 and into the layers 31 and 22 of the cells connected by the band 36. The cavity thus extends from the upper surface of the layer 32 to the layer 18. The cavity thus extends through the layer 22 and the layer 31 in the memory cell. Between the memory cells, the cavity extends into the layer 31. The cavity is then filled with a conductive material, such as a metal.

FIG. 10 illustrates an alternative step to the steps in FIGS. 8 and 9. That is, this step is performed instead of the step in FIG. 8 or 9, following the FIG. 7 step. Specifically, FIG. 10 shows the formation of a conductive band 38 connecting the cells in the same line or column of the memory array.

In this step, the layers 32, 31 layer 22 are etched in a planar fashion until the upper surface of the layer 18 is exposed. A planar layer of a conductive material, such as a metal, is then formed on the structure obtained after etching. The layer thus covers the upper surface of the layer 18 and the upper surfaces of the layers 31 and 32 around the memory cell. The conductive layer is then etched so that a band extending over the layers 18 of a plurality of cells, in the first direction, is retained. In a second direction, the band 38 extends across the entire layer 18 and partially across the upper surface of the layer 31, for example.

The embodiments are described for manufacturing a single memory cell. The methods can be used to simultaneously manufacture a plurality of cells, such as an array of memory cells. The method then comprises forming a mask 20 covering each memory cell location and simultaneously etching the stack of layers around the memory cell locations, i.e. etching the portions of the stack not covered by the masks 20.

One advantage of the described embodiments is that the phase change material layer is not etched at the same time as another material.

Another advantage of the described embodiments is that the described methods comprise an etching step and layer deposition steps in relation to known methods.

Various embodiments and variants have been described. Those skilled in the art will understand that certain features of these embodiments can be combined and other variants will readily occur to those skilled in the art.

Finally, the practical implementation of the embodiments and variants described herein is within the capabilities of those skilled in the art based on the functional description provided hereinabove.

The invention claimed is:

1. A method for manufacturing a memory cell, comprising:
   (a) forming a stack comprising a first layer made of a phase change material and a second layer made of a conductive material;
   (b) forming a first mask on the stack which covers only a location of the memory cell;
   (c) etching portions of the stack that are not covered by the first mask;
   wherein step b) comprises:
      depositing a fourth layer made of a same material as the first mask on the stack;
      forming a second mask extending in a first direction and covering the memory cell location;
      etching portions of the fourth layer not covered by the second mask;
      forming a third mask extending in a second direction and covering the location of the memory cell; and
      etching portions of the fourth layer not covered by the third mask.

2. The method according to claim 1, wherein step a) comprises forming at least a third layer made of an electrically insulating material between the second layer and the first mask.

3. The method according to claim 1, wherein etching in step c) does not etch the phase change material of the first layer and material of another layer in the stack at the same time.

4. The method according to claim 1, further comprising forming a resistive element in contact with the first layer.

5. The method according to claim 1, wherein etching portions of the fourth layer etches a material of the fourth layer at least twenty times faster than etching a material of a layer located below the fourth layer.

6. The method according to claim 1, wherein the first mask is made of titanium nitride.

7. The method according to claim 1, wherein the first layer is made of a germanium, antimony and tellurium alloy.

8. The method according to claim 1, wherein said memory cell is one memory cell in an array of memory cells.

9. The method according to claim 8, further comprising depositing at least one electrically insulating layer on the memory cells of the array.

10. A method for manufacturing a memory cell, comprising:
   (a) forming a stack comprising a first layer made of a phase change material and a second layer made of a conductive material;
   (b) forming a first mask on the stack which covers only a location of the memory cell; and
   (c) etching portions of the stack that are not covered by the first mask;
   wherein said memory cell is one memory cell in an array of memory cells; and
   wherein a first mask is formed over the location of each memory cell in the array, and wherein step c) is performed simultaneously for all memory cells.

11. The method according to claim 10, wherein step a) comprises forming at least a third layer made of an electrically insulating material between the second layer and the first mask.

12. The method according to claim 10, wherein etching in step c) does not etch the phase change material of the first layer and material of another layer in the stack at the same time.

13. The method according to claim 10, further comprising forming a resistive element in contact with the first layer.

14. The method according to claim 10, wherein the first mask is made of titanium nitride.

15. The method according to claim 10, wherein the first layer is made of a germanium, antimony and tellurium alloy.

16. The method according to claim 10, wherein said memory cell is one memory cell in an array of memory cells.

17. A method for manufacturing a memory cell, comprising:
(a) forming a stack comprising a first layer made of a phase change material and a second layer made of a conductive material;
(b) forming a first mask on the stack which covers only a location of the memory cell; and
(c) etching portions of the stack that are not covered by the first mask;
wherein said memory cell is one memory cell in an array of memory cells; and
depositing electrically conductive vias through the electrically insulating layer so as to reach the second layer.

18. The method according to claim 17, wherein step a) comprises forming at least a third layer made of an electrically insulating material between the second layer and the first mask.

19. The method according to claim 17, wherein etching in step c) does not etch the phase change material of the first layer and material of another layer in the stack at the same time.

20. The method according to claim 17, further comprising forming a resistive element in contact with the first layer.

21. The method according to claim 17, wherein the first mask is made of titanium nitride.

22. The method according to claim 17, wherein the first layer is made of a germanium, antimony and tellurium alloy.

23. The method according to claim 17, wherein said memory cell is one memory cell in an array of memory cells.

24. A method for manufacturing a memory cell, comprising:
(a) forming a stack comprising a first layer made of a phase change material and a second layer made of a conductive material;
(b) forming a first mask on the stack which covers only a location of the memory cell; and
(c) etching portions of the stack that are not covered by the first mask;
wherein said memory cell is one memory cell in an array of memory cells; and
forming a conductive band extending over the second layers of memory cells in a line or column of the array.

25. The method according to claim 24, wherein step a) comprises forming at least a third layer made of an electrically insulating material between the second layer and the first mask.

26. The method according to claim 24, wherein etching in step c) does not etch the phase change material of the first layer and material of another layer in the stack at the same time.

27. The method according to claim 24, further comprising forming a resistive element in contact with the first layer.

28. The method according to claim 24, wherein the first mask is made of titanium nitride.

29. The method according to claim 24, wherein the first layer is made of a germanium, antimony and tellurium alloy.

30. The method according to claim 24, wherein said memory cell is one memory cell in an array of memory cells.

31. A method for manufacturing a memory array including a plurality of memory cells arranged in columns and rows, comprising:
(a) forming a stack comprising a plurality of layer in the following order: a first layer made of a phase change material; a second layer made of a conductive material; an electrically insulating layer; and a fourth layer made of a lithographic material;
(b) forming a first band on the fourth layer which covers memory cell locations along each row;
(c) using the first band to lithographically pattern the fourth layer to form a first mask which covers memory cell locations along each row;
(d) forming a second band on the first mask which covers memory cell locations along each column;
(e) using the second band to lithographically pattern the first mask to form a second mask which individually covers each memory cell location along the columns and rows;
(f) etching portions of the stack that are not covered by the second mask to define individual memory cells.

32. The method of claim 31, wherein said electrically insulating layer comprises: a first insulating layer made of a first electrically insulating material; and a second insulating layer made of a second electrically insulating material.

33. The method of claim 32, wherein the first electrically insulating material is silicon nitride and the second electrically insulating material is amorphous carbon.

34. The method of claim 31, wherein the lithographic material is an anti-reflective material for lithography.

35. The method of claim 34, wherein the anti-reflective material for lithography is titanium nitride.

36. The method according to claim 31, wherein the first layer is made of a germanium, antimony and tellurium alloy and the second layer is made of titanium nitride.

37. The method according to claim 31, further comprising depositing at least one electrically insulating layer on the individual memory cells.

38. The method according to claim 37, further comprising depositing electrically conductive vias through the electrically insulating layer so as to reach the second layer of each individual memory cell.

39. The method according to claim 37, further comprising forming a conductive band extending in contact with portions of the second layer in the individual memory cells of cells in a row or column of the array.

40. A method for manufacturing a memory cell, comprising:
forming a stack comprising a first layer made of a phase change material and a second layer made of a conductive material;
depositing a layer made of a first material on the stack;
forming a first direction mask extending in a first direction and covering a location of the memory cell;
etching portions of the layer made of the first material which are not covered by the first direction mask;
forming a second direction mask extending in a second direction orthogonal to the first direction and covering the location of the memory cell;

etching portions of the layer made of the first material which are not covered by the second direction mask; and using a remaining portion of the layer made of the first material after said etching using the first and second direction masks as an etching mask for etching the stack to define the memory cell.

41. The method according to claim 40, further comprising forming an electrically insulating material layer between the second layer and the layer made of the first material.

42. The method according to claim 40:
wherein etching portions of the layer made of the first material which are not covered by the first direction mask stops before reaching the phase change material of the first layer; and
wherein etching portions of the layer made of the first material which are not covered by the second direction mask stops before reaching the phase change material of the first layer.

43. The method according to claim 40, wherein the first material is titanium nitride.

44. The method according to claim 40, wherein the phase change material of the first layer is a germanium, antimony and tellurium alloy.

\* \* \* \* \*